(12) United States Patent
Chou

(10) Patent No.: US 7,884,312 B2
(45) Date of Patent: Feb. 8, 2011

(54) SENSOR DEVICE USABLE AS A SWITCH

(76) Inventor: Tien-Ming Chou, No. 41, San-Hsi 5th Street, Taichung City (TW)

( * ) Notice: Subject to any disclaimer, the term of this patent is extended or adjusted under 35 U.S.C. 154(b) by 0 days.

(21) Appl. No.: 12/015,279

(22) Filed: Jan. 16, 2008

(65) Prior Publication Data

US 2009/0108189 A1    Apr. 30, 2009

(51) Int. Cl.
*H03K 17/78* (2006.01)
*H01J 5/02* (2006.01)
(52) U.S. Cl. ................................. 250/214 SW; 250/239
(58) Field of Classification Search ................. 250/239, 250/221, 216, 214 SW, 231.1; 345/166, 167, 345/164; 200/61.45 R, 61.52
See application file for complete search history.

(56) References Cited

U.S. PATENT DOCUMENTS 6,800,841 B1 * 10/2004 Chou ...................... 250/231.1

* cited by examiner

*Primary Examiner*—Que T Le
*Assistant Examiner*—Pascal M Bui-Pho
(74) *Attorney, Agent, or Firm*—Gregory & Martensen LLP

(57) ABSTRACT

A sensor device includes a base wall, a plurality of sidewalls cooperating with the base wall to define a receiving space that has an open end, an emitter disposed in the receiving space and having an emitter element to emit a light signal, a receiver disposed in the receiving space and having a receiver element to receive the light signal, a cover body disposed in the receiving space between the emitter and the receiver, a ball chamber formed between inner surfaces of the base wall and the cover body, a ball member disposed movably in the ball chamber, an emitter light passage optically communicating with the ball chamber and the emitter, and a receiver light passage optically communicating with the ball chamber and the receiver. The cover body, the emitter, and the receiver cooperatively close the open end of the receiving space.

15 Claims, 22 Drawing Sheets

US 7,884,312 B2

SENSOR DEVICE USABLE AS A SWITCH

BACKGROUND OF THE INVENTION

1. Field of the Invention

The invention relates to a switch, more particularly to a sensor device that may be used as a switch.

2. Description of the Related Art

Referring to FIGS. 1 and 2, a conventional vibration switch 10, as disclosed in U.S. Pat. No. 6,740,867, includes an insulated casing 11, an emitter 12 and a receiver 13 disposed in the insulated casing 11 and spaced apart from each other, a seal member 14 disposed in the insulated casing 11, a conductive ball member 15 disposed rollably in the seal member 14, and an insulated cover 16 covering the insulated casing 11. The insulated casing 11 has a central concavity 111, two side concavities 112, 113 located respectively on two opposite sides of the central concavity 111, an emitter slit 114 communicating with the central concavity 111 and the side concavity 112, and a receiver slit 115 communicating with the central concavity 111 and the side concavity 113.

The emitter 12 is retained in the side concavity 112, and has a light emitting point 121 located in the emitter slit 114 to emit light, and a pair of contact terminals 122 extending downwardly and outwardly of the insulated casing 11. The receiver 13 is retained in the side concavity 113, and has a light receiving point 131 located in the receiver slit 115 to receive the light emitted by the emitter 12, and two contact terminals 132 extending downwardly and outwardly of the insulated casing 11.

The seal member 14 is disposed in the central concavity 111, and has two sealing parts 141, 142 fitted to each other, a ball chamber 143 confined cooperatively by the sealing parts 141, 142, and two openings 144, 145 formed respectively in the sealing parts 141, 142. The conductive ball member 15 is configured as a transparent ball, and is disposed in the ball chamber 143 between the light emitting point 121 and the light receiving point 131.

In use, the emitter 12 emits light through the light emitting point 121. The light passes through the opening 144 in the sealing part 141 towards the conductive ball member 15. The light is refracted as it passes through the conductive ball member 15 so that some of the light rays that pass through the opening 145 are received by the light receiving point 131 of the receiver 13. When the light receiving point 131 receives a stable light signal, the vibration switch 10 may be set to a first state, for example, an ON state. When the vibration switch 10 is acted upon by an external force, the conductive ball member 15 is rolled in the ball chamber 143 so as to change the amount of refraction of the light. As such, the light receiving point 131 receives light signals of varying intensity. When this occurs, the vibration switch 10 may be set to a second state, for example, an OFF state.

Although the aforementioned vibration switch 10 can achieve its intended purpose, it has many components, its assembly is time-consuming, and it has a large volume.

SUMMARY OF THE INVENTION

Therefore, the object of the present invention is to provide a sensor device that is capable of overcoming the aforementioned drawbacks of the prior art.

According to this invention, a sensor device comprises a casing, an emitter, a receiver, a cover body, a ball chamber, a ball member disposed movably in the ball chamber, an emitter light passage optically communicating with the ball chamber and the emitter, and a receiver light passage optically communicating with the ball chamber and the receiver. The casing includes a base wall, and a plurality of sidewalls extending transversely from a peripheral end of the base wall and cooperating with the base wall to define a receiving space that has an open end opposite to the base wall. The sidewalls include two opposite first sidewalls and two opposite second sidewalls transverse to the first sidewalls. The base wall has an inner surface facing the receiving space. The emitter is disposed in the receiving space in proximity to one of the first sidewalls, and includes an emitter element to emit a light signal. The receiver is disposed in the receiving space in proximity to the other one of the first sidewalls, and includes a receiver element to receive the light signal. The cover body is disposed in the receiving space between the second sidewalls and between the emitter and the receiver. The cover body, the emitter, and the receiver cooperatively close the open end of the receiving space. The cover body has an inner surface. The ball chamber is formed between the inner surfaces of the base wall and the cover body.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
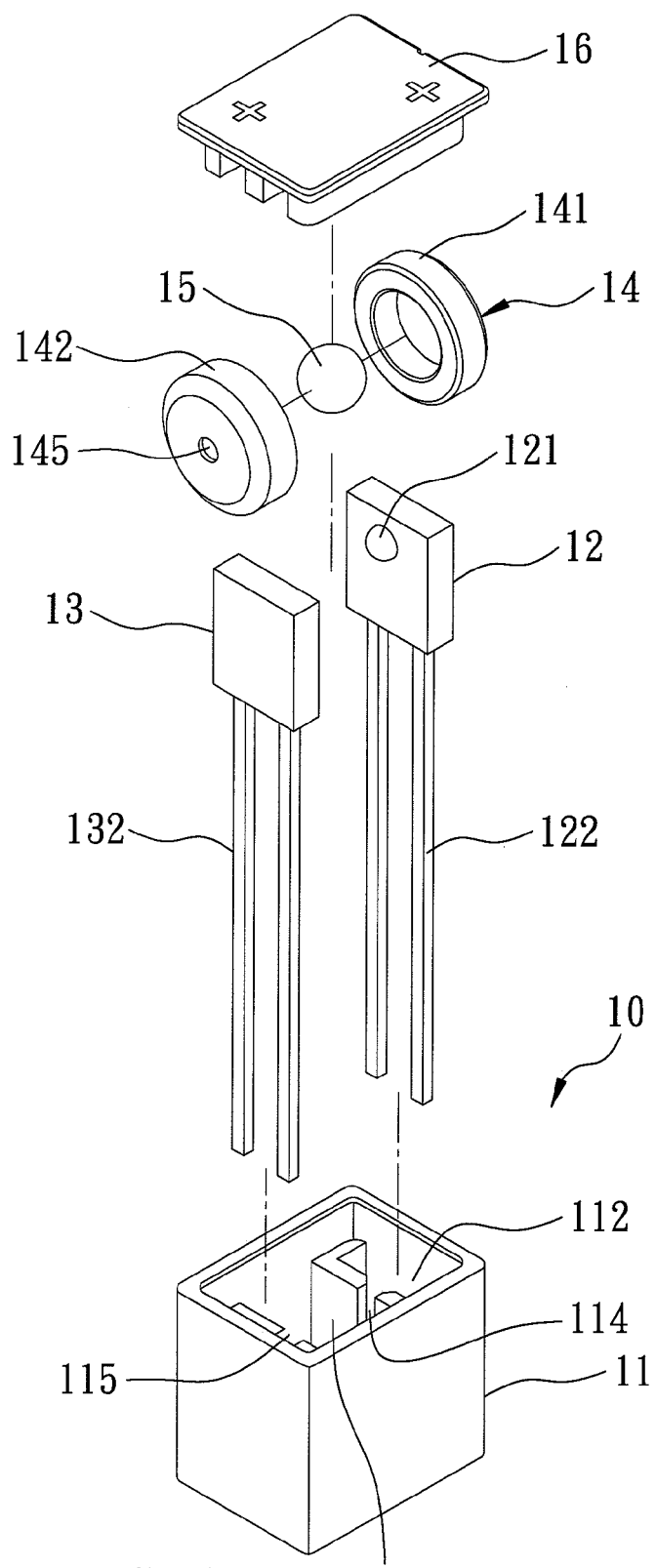
FIG. 1 is an exploded perspective view of a conventional vibration switch disclosed in U.S. Pat. No. 6,740,867.
Figure 2:
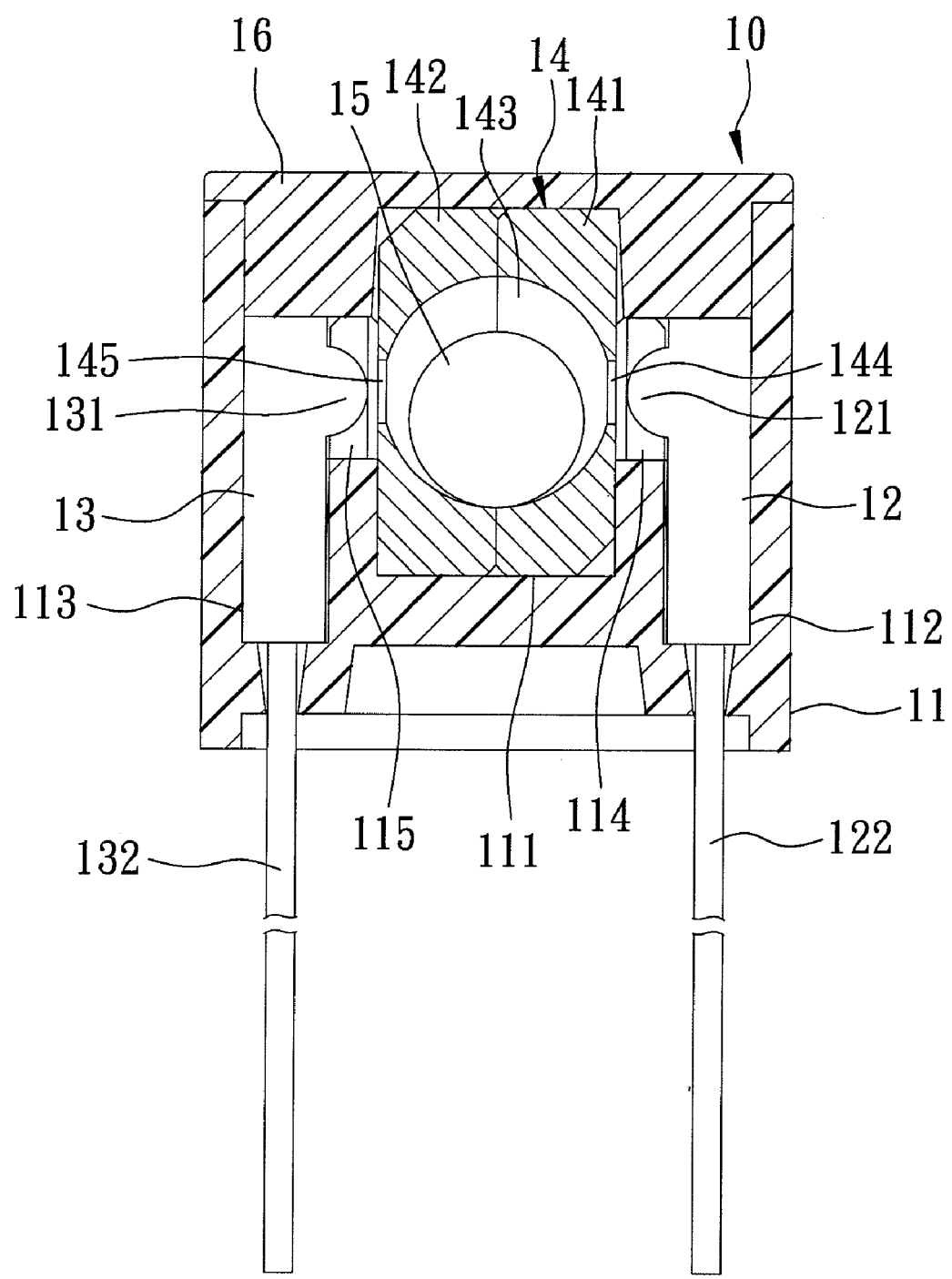
FIG. 2 is a sectional view of the conventional vibration switch of FIG. 1 in an assembled state.
Figure 3:
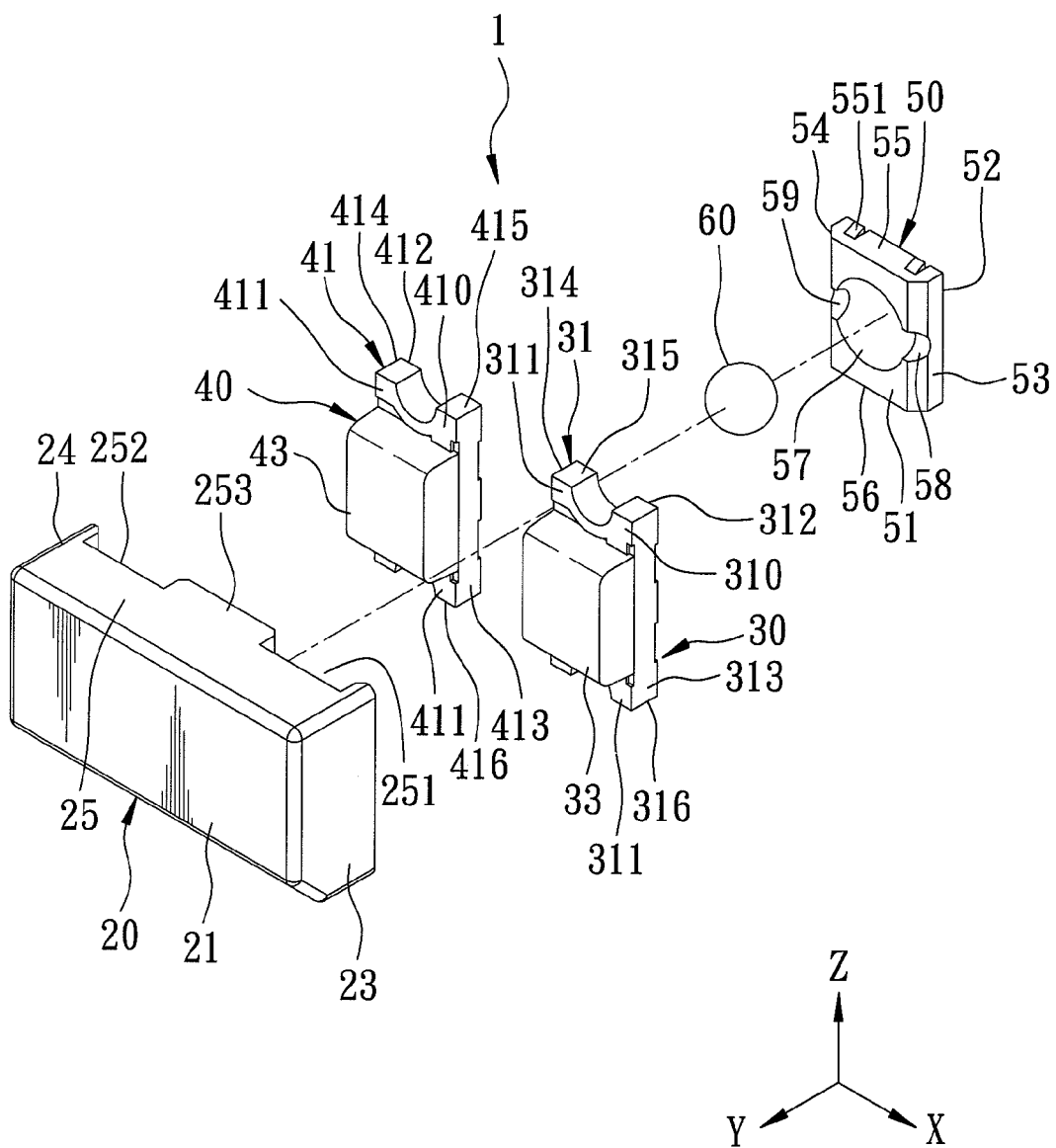
FIG. 3 is an exploded perspective view of the first preferred embodiment of a sensor device according to the present invention.
Figure 4:
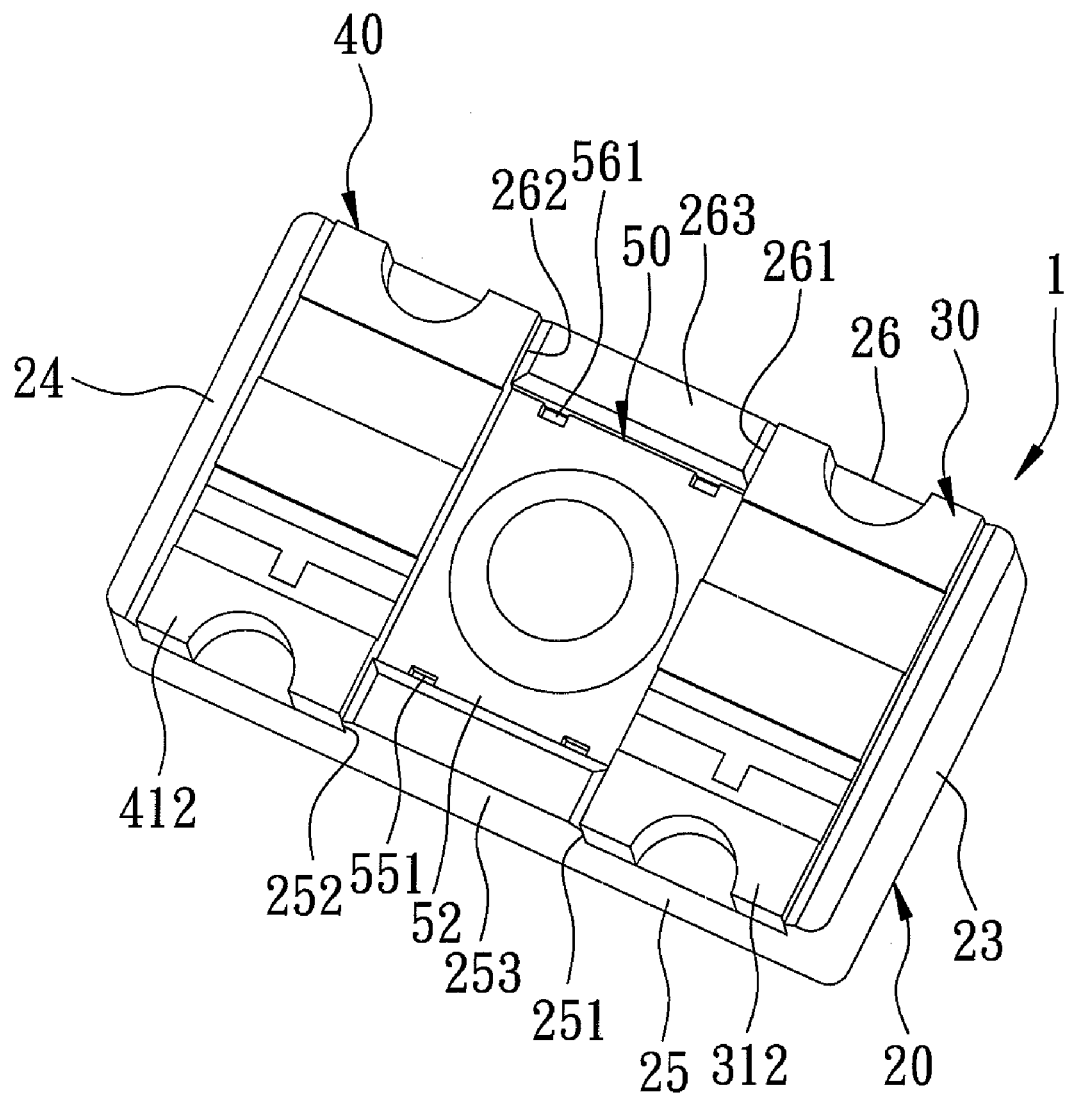
FIG. 4 is an assembled perspective view of the first preferred embodiment.
Figure 5:
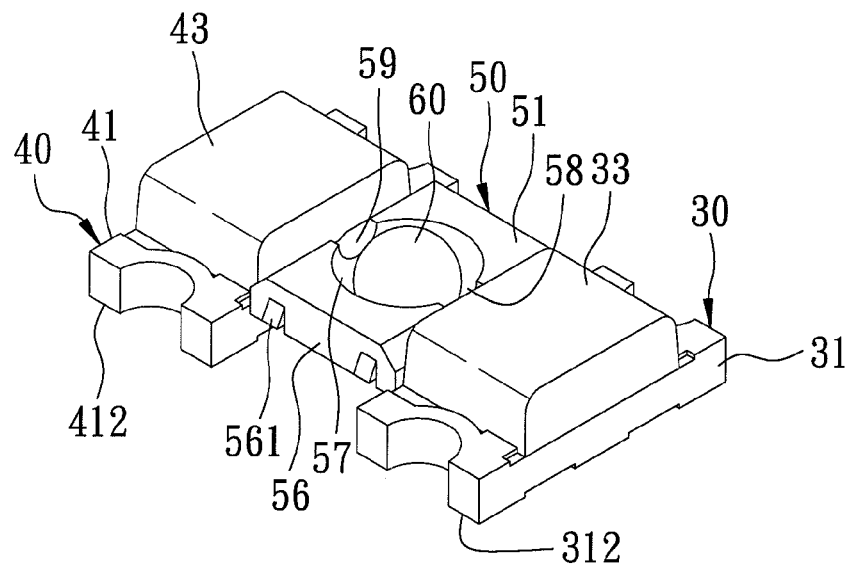
FIG. 5 is an assembled perspective view of an emitter, a receiver, a cover body, and a ball member of the first preferred embodiment.
Figure 6:
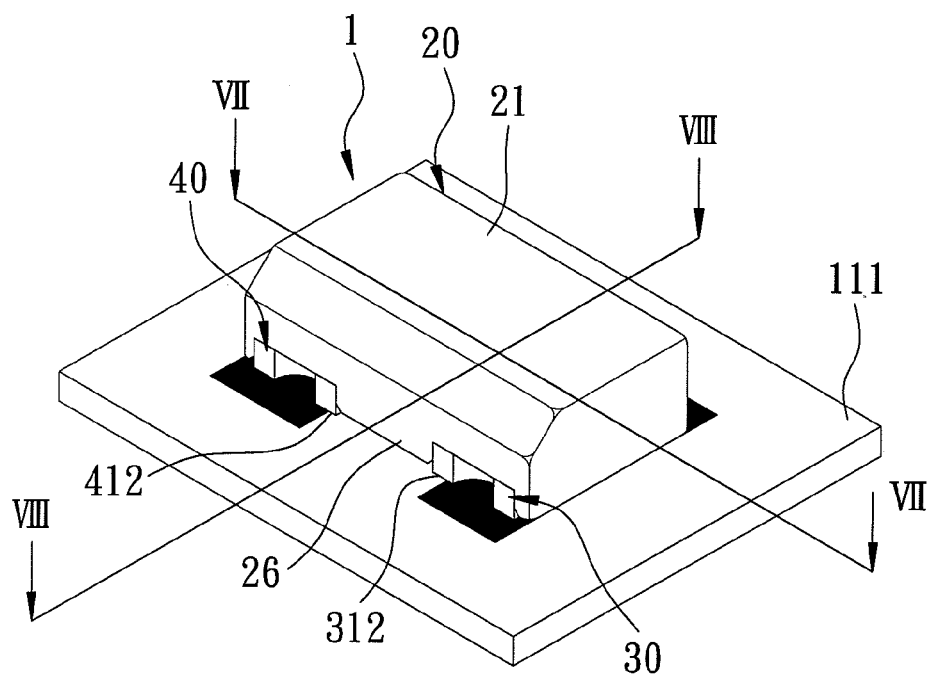
FIG. 6 is a perspective view, illustrating the sensor device of the first preferred embodiment connected to a circuit board.
Figure 7:
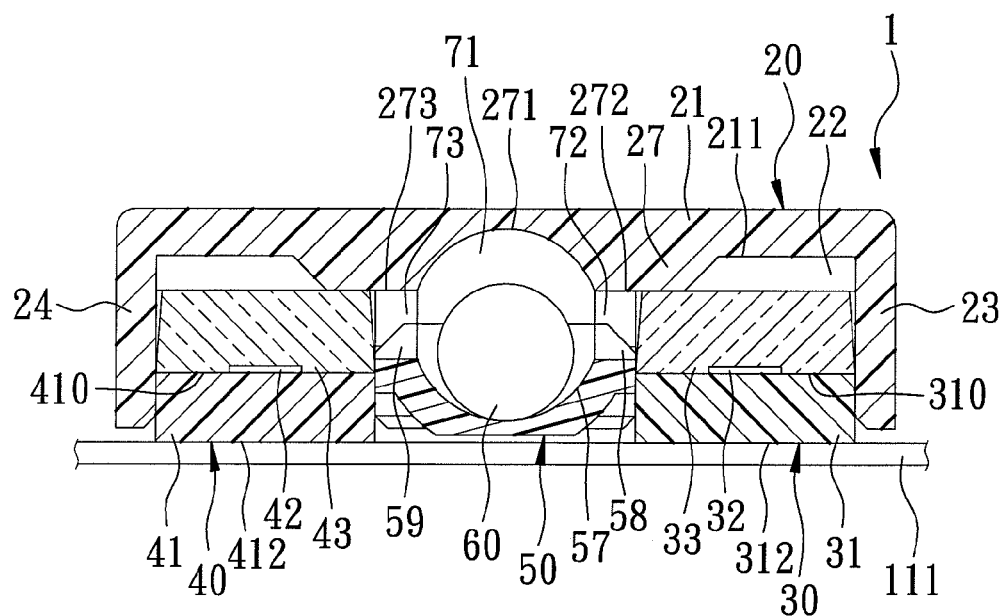
FIG. 7 is a sectional view of the first preferred embodiment taken along line VII-VII of FIG. 6.
Figure 8:
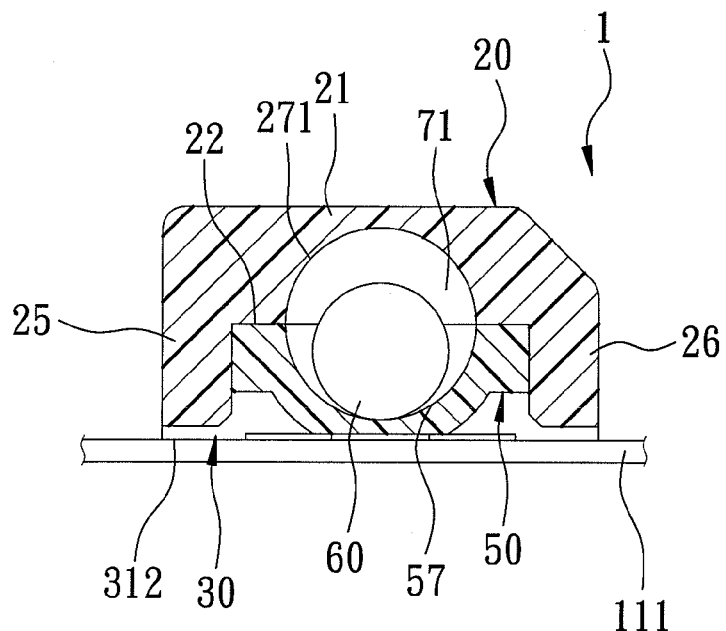
FIG. 8 is a sectional view of the first preferred embodiment taken along line VIII-VIII of FIG. 6.

Before the present invention is described in greater detail, it should be noted that like elements are denoted by the same reference numerals throughout the disclosure.

Referring to FIGS. 3 to 8, a sensor device 1 according to the first preferred embodiment of the present invention is shown to comprise a casing 20, an emitter 30, a receiver 40, a cover body 50, and a ball member 60.

The casing 20 includes a base wall 21 that extends along an X-axis, and a plurality of sidewalls extending transversely from a peripheral end of the base wall 21 along a Y-axis and cooperating with the same to define a receiving space 22 that has an open end opposite to the base wall 21. The base wall 21 has an inner surface 211 facing the receiving space 22 and that has an intermediate part 27 that is protruded and that is grooved to form a semi-spherical first ball chamber half 271, and a first emitter passage half 272 and a first receiver passage half 273 provided respectively on two opposite sides of the first ball chamber half 271. The first emitter passage half 272 and the first receiver passage half 273 communicate spatially with the first ball chamber half 271 and the receiving space 22. In this embodiment, the four sidewalls of the casing 20 include two opposite first sidewalls 23, 24, and two opposite second sidewalls 25, 26 transverse to the first sidewalls 23, 24. Each of the second sidewalls 25, 26 is grooved to form first and second engaging grooves 251, 261, 252, 262 in proximity to the first sidewalls 23, 24, respectively, and has an ungrooved intermediate portion 253, 263 between the first and second engaging grooves 251, 261, 252, 262.

The emitter 30 is disposed in the receiving space 22 in proximity to the first sidewall 23, and includes an emitter substrate body 31 having two opposite first connecting portions 311, an emitter element 32 that is disposed on an inner face 310 of the emitter substrate body 31, that is connected electrically to the emitter substrate body 31, and that emits a light signal, and an emitter transparent body 33 fixed to a portion of the inner face 310 of the emitter substrate body 31 between the first connecting portions 311 and covering the emitter element 32. The emitter substrate body 31 further has an outer face 312 opposite to the inner face 310, and four side faces 313, 314, 315, 316 interconnecting end peripheries of the inner and outer faces 310, 312. The emitter transparent body 33 is disposed between and is engaged to the second sidewalls 25, 26. The first connecting portions 311 engage respectively the first engaging grooves 251, 261 of the second sidewalls 25, 26. In this embodiment, the emitter 30 is a chip emitter.

The receiver 40 is disposed in the receiving space 22 in proximity to the first sidewall 24, and includes a receiver substrate body 41 having two opposite second connecting portions 411, a receiver element 42 that is disposed on an inner face 410 of the receiver substrate body 41, that is connected electrically to the receiver substrate body 41, and that receives the light signal emitted by the emitter element 32, and a receiver transparent body 43 fixed to a portion of the inner face 410 of the receiver substrate body 41 between the second connecting portions 411 and covering the receiver element 42. The receiver substrate body 41 further has an outer face 412 opposite to the inner face 410, and four side faces 413, 414, 415, 416 interconnecting end peripheries of the inner and outer faces 410, 412. The receiver transparent body 43 is disposed between and is engaged to the second sidewalls 25, 26. The second connecting portions 411 engage respectively the second engaging grooves 252, 262 of the second sidewalls 25, 26. In this embodiment, the receiver 40 is a chip receiver. The emitter and receiver substrate bodies 33, 43 are disposed in the receiving space 22 substantially parallel to the base wall 21.

The cover body 50 has inner and outer surfaces 51, 52, and four side surfaces 53, 54, 55, 56 interconnecting end peripheries of the inner and outer surfaces 51, 52. The inner surface 51 is grooved to form a semi-spherical second ball chamber half 57, and a second emitter passage half 58 and a second receiver passage half 59 provided respectively on two opposite sides of the second ball chamber half 57. Preferably, the side surfaces 55 and 56 of the cover body 50 are provided respectively with a plurality of slant guide pieces 551, 561.

The cover body 50 is disposed in the receiving space 22 between the second sidewalls 25, 26 and between the emitter 30 and the receiver 40. The cover body 50, the emitter 30, and the receiver 40 cooperatively close the open end of the receiving space 22. The cover body 50 engages the second sidewalls 25, 26 between the ungrooved intermediate portions 253, 263 through the slant guide pieces 551, 561. After the cover body 50 is positioned in the casing 20, the first and second ball chamber halves 271, 57 cooperate with each other to confine a ball chamber 71, the first and second emitter passage halves 272, 58 complement each other to confine an emitter light passage 72, and the first and second receiver passage halves 273, 59 complement each other to confine a receiver light passage 73 that is aligned with the emitter light passage 72. The emitter light passage 72 optically communicates with the ball chamber 71 and the emitter 30. The receiver light passage 73 optically communicates with the ball chamber 71 and the receiver 40.

The ball member 60, in this embodiment, is transparent, and is disposed movably in the ball chamber 71.

In use, the outer faces 312, 412 of the emitter and receiver substrate bodies 31, 41 are soldered to a circuit board 111 so as to interconnect electrically the sensor device 1 and the circuit board 111. When power is supplied to the sensor device 1, the emitter element 32 emits light that passes through the emitter light passage 72 toward the ball member 60. The light refracts and passes through the receiver light passage 73 so as to be received by the receiver element 42. A stable light signal is received by the receiver element 42 at this time, thereby placing the sensor device 1 in an ON state. When the sensor device 1 is acted upon by an external force, the ball member 60 vibrates within the ball chamber 71, and the light refracts with different intensities, so that the receiver element 42 receives an unstable light signal, thereby switching the sensor device 1 to an OFF state. Through such an operation, the sensor device 1 may be used as a vibration switch.

In this embodiment, the emitter and receiver elements 32, 42 are respectively configured to emit and receive light sidewardly.

Figure 9:
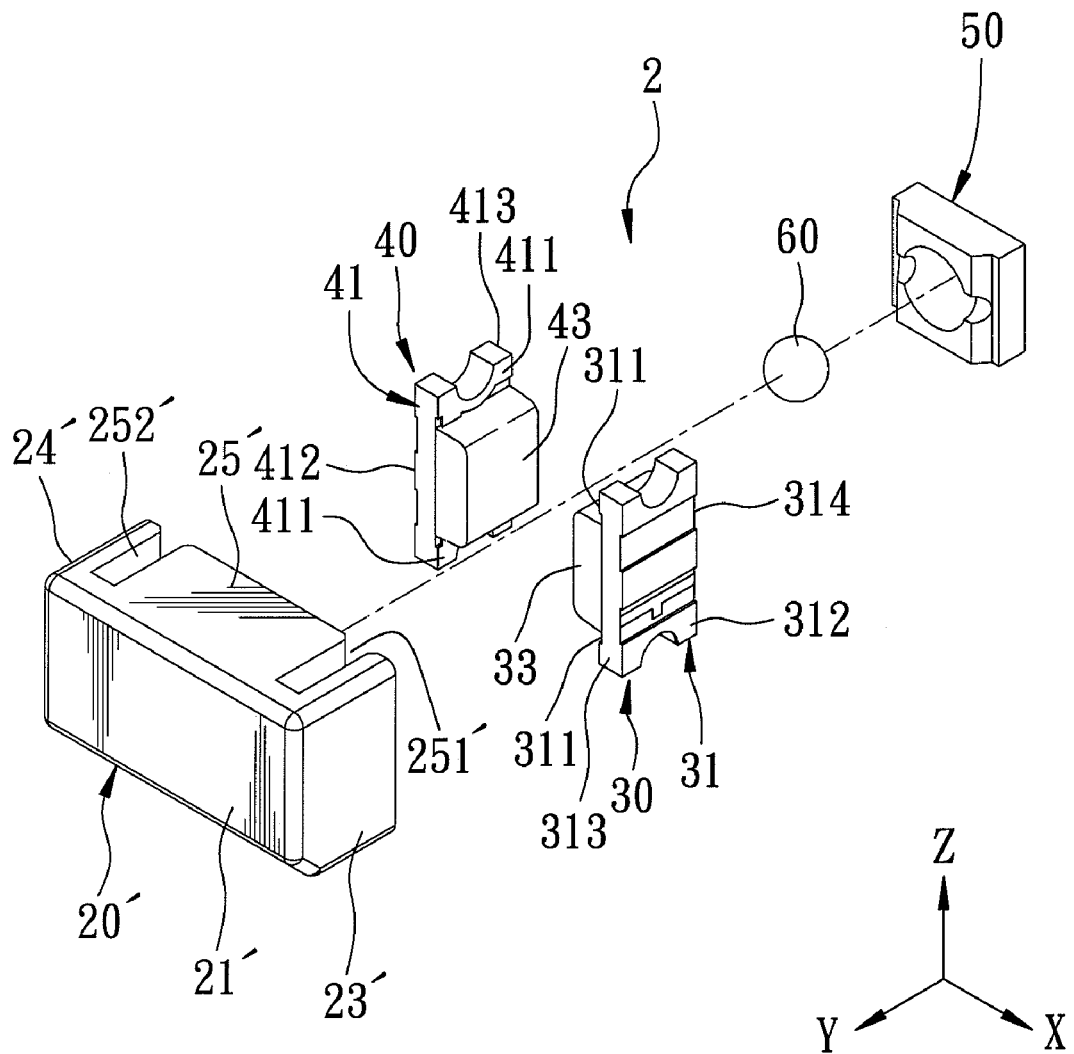
FIG. 9 is an exploded perspective view of the second preferred embodiment of a sensor device according to the present invention.
Figure 10:
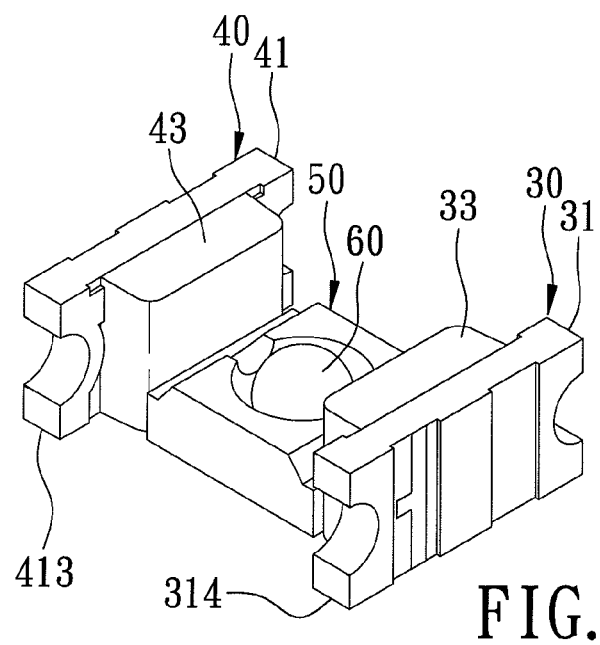
FIG. 10 is an assembled perspective view of an emitter, a receiver, a ball member, and a cover body of the second preferred embodiment.
Figure 11:
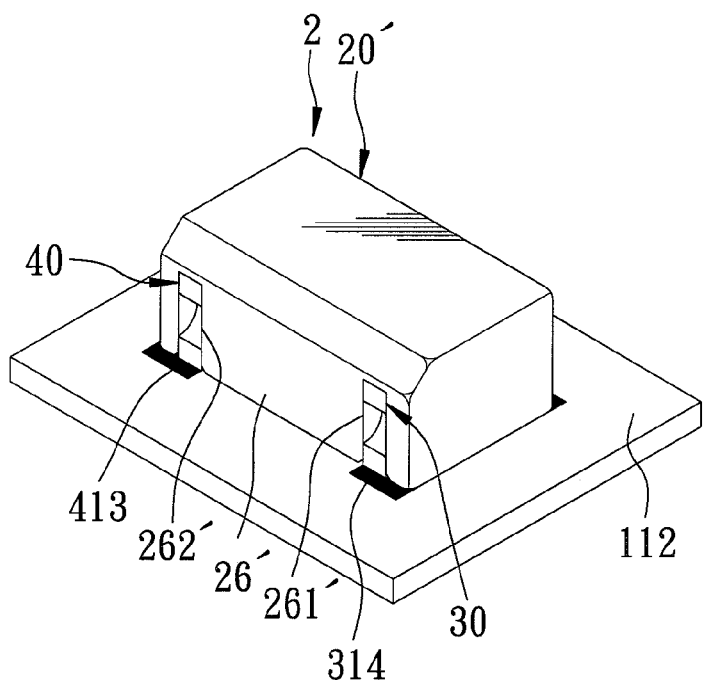
FIG. 11 is a perspective view, illustrating the sensor device of FIG. 9 connected to a circuit board.
Figure 12:
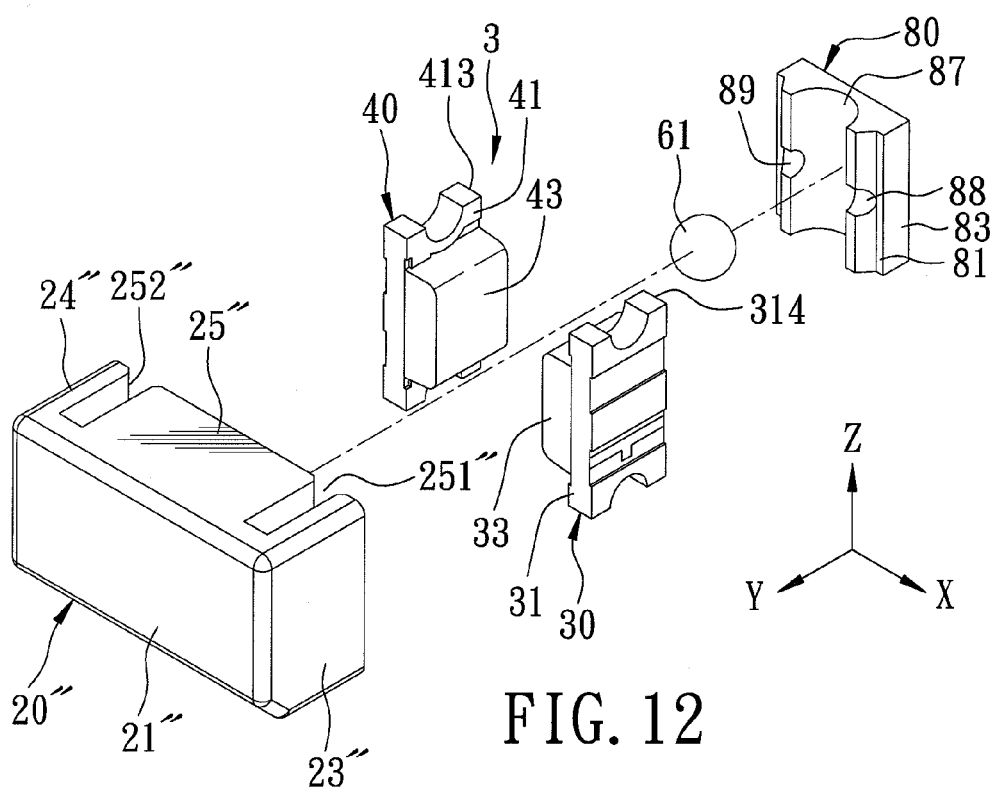
FIG. 12 is an exploded perspective view of the third preferred embodiment of a sensor device according to the present invention.
Figure 13:
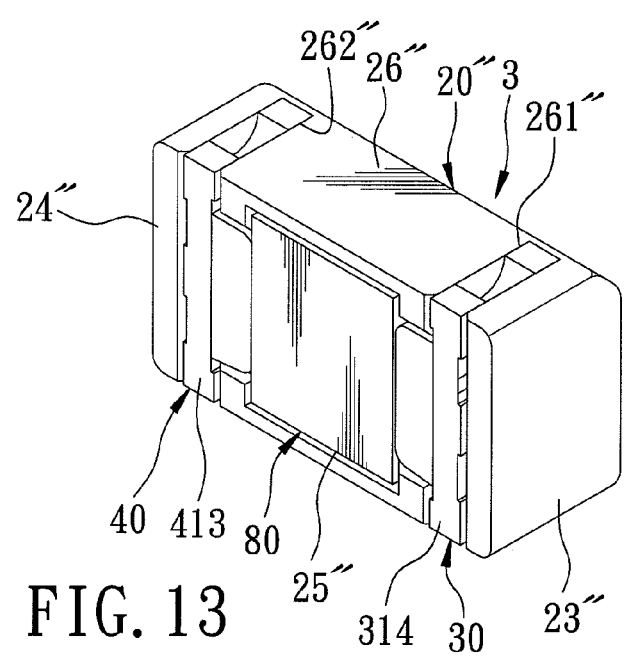
FIG. 13 is an assembled perspective view of the third preferred embodiment.

Referring to FIGS. 9, 10, and 11, a sensor device 2 according to the second preferred embodiment of the present invention is shown to be similar to the first preferred embodiment. However, in this embodiment, the second sidewalls 25', 26' of the casing 20' are respectively grooved in such a way that the first engaging grooves 251', 261' can receive and engage respectively the first connecting portions 311 of the emitter substrate body 31, and that the second engaging grooves 252', 262' can receive and engage respectively the second connecting portions 411 of the receiver substrate body 41 when the emitter 30 and the receiver 40 are disposed transversely to the base wall 21' along the Y-axis. The emitter and receiver elements 32, 42 (see FIG. 4) face each other at this time, and the side faces 314, 413 of the emitter and receiver substrate bodies 31, 41 may be soldered fixedly to a circuit board 112.

Referring to FIGS. 12 to 18, a sensor device 3 according to the third preferred embodiment of the present invention is shown to be similar to the second preferred embodiment. However, in this embodiment, the intermediate part 28 of the inner surface 211" of the basewall 21" is grooved to form a semi-cylindrical first ball chamber half 281 that extends transversely to the base wall 21" along a Z-axis that is transverse to the X-axis and the Y-axis, and a first emitter passage half 282 and a first receiver passage half 283 provided respectively on two opposite sides of the first ball chamber half 281. The inner surface 81 of the cover body 80 is also grooved to form a semi-cylindrical second ball chamber half 87 that extends through two opposite ends of the cover body 80 along the Z-axis and that cooperates with the first ball chamber half 281 to define a cylindrical ball chamber 74, and a second emitter passage half 88 and a second receiver passage half 89 provided respectively on two opposite sides of the second ball chamber half 87. The first and second emitter passage halves 282, 88 complement each other to confine an emitter light passage 75. The first and second receiver passage halves 283, 89 complement each other to confine a receiver light passage 76 that is aligned with the emitter light passage 75 and that cooperates with the same to define a signal path (I). The ball member 61, in this embodiment, is non-transparent, and is rollable within the ball chamber 74 so as to block and unblock the signal path (I).

Figure 14:
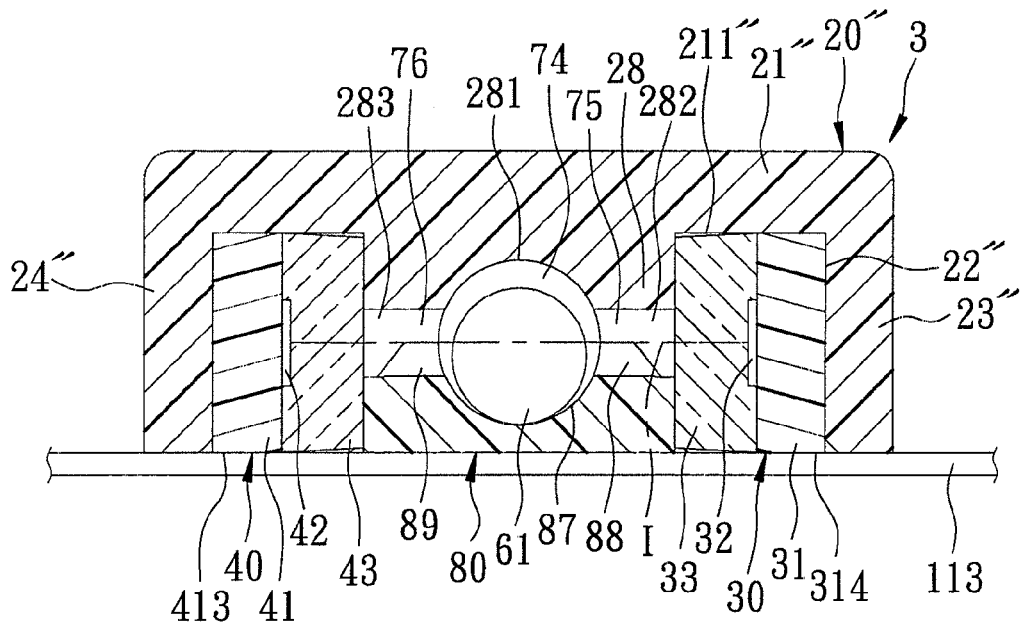
FIG. 14 is an assembled sectional view of the third preferred embodiment.
Figure 15:
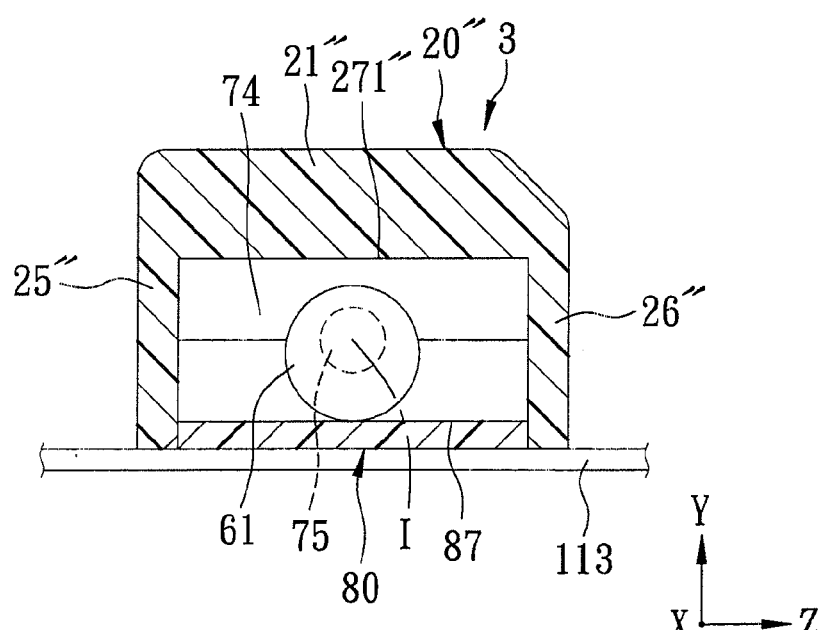
FIG. 15 is another assembled sectional view of the third preferred embodiment, illustrating a ball member blocking a signal path.
Figure 16:
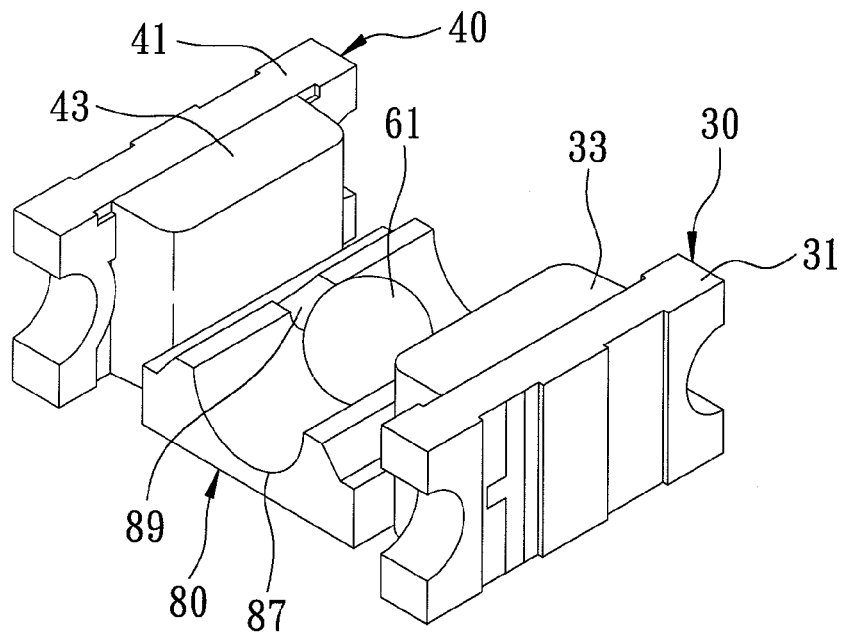
FIG. 16 is an assembled perspective view of an emitter, a receiver, a cover member, and the ball member of the third preferred embodiment.
Figure 17:
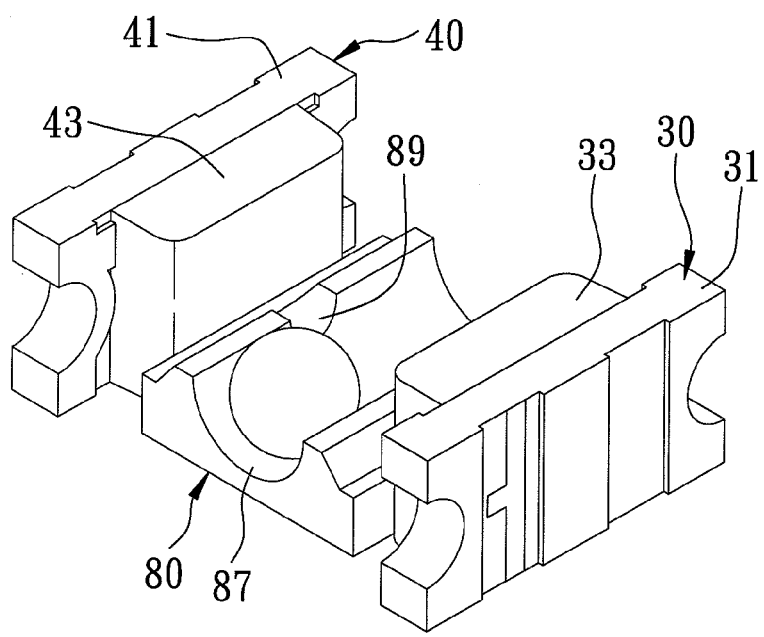
FIG. 17 is a view similar to FIG. 16, but illustrating the ball member disposed on one side of a ball chamber and away from blocking the signal path.
Figure 18:
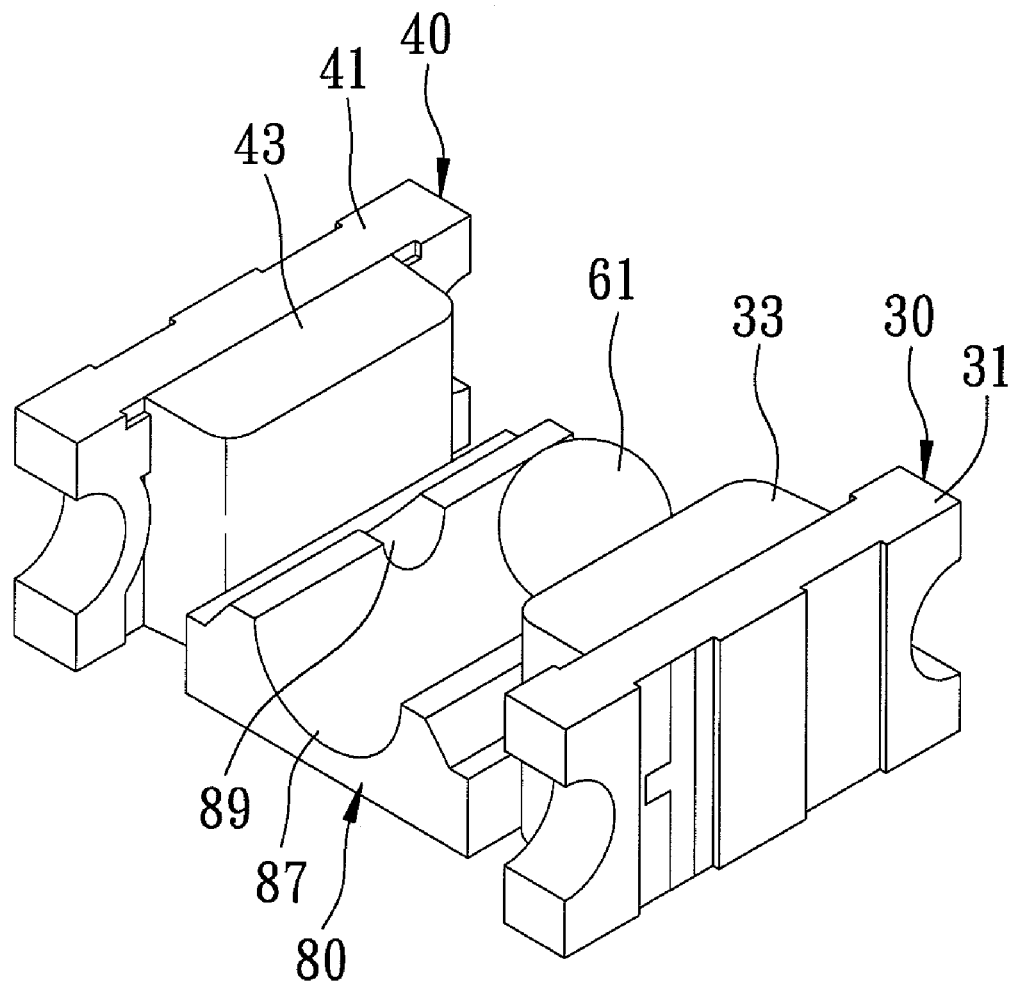
FIG. 18 is a view similar to FIG. 16, but illustrating the ball member disposed on another side of the ball chamber and away from blocking the signal path.

In use, the side faces 314, 413 of the emitter and receiver substrate bodies 31, 41 are soldered fixedly to a circuit board 113 so as to interconnect electrically the sensor device 3 and the circuit board 113. When power is supplied to the sensor device 3, the emitter element 32 emits light that passes through the emitter light passage 75 into the ball chamber 74. As shown in FIGS. 14 to 16, when the ball member 61 is located between the emitter light passage 75 and the receiver light passage 76, i.e., when the ball member 61 is blocking the signal path (I), the receiver element 42 cannot receive the light emitted by the emitter element 32. At this time, the sensor device 3 is placed in an OFF state. When the sensor device 3 is tilted, the ball member 61 rolls away from blocking the signal path (I), as shown in FIGS. 17 and 18, so that the light emitted by the emitter element 32 can be received by the receiver element 42, thereby switching the sensor device 3 to an ON state. Through such an operation, the sensor device 3 may be used as a two-way switch or an angular switch.

Figure 19:
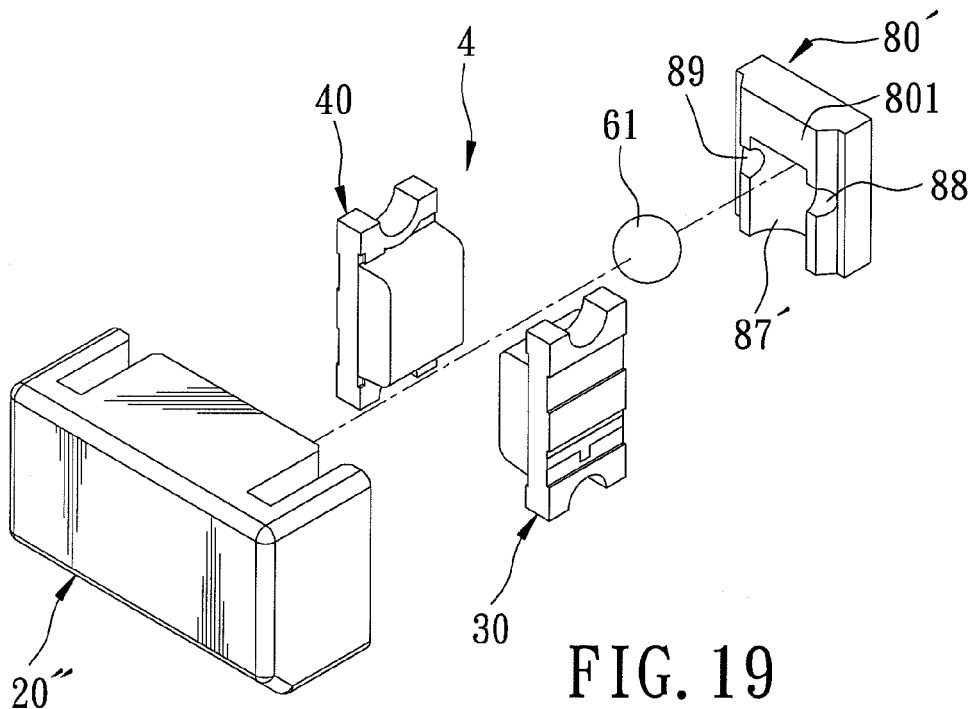
FIG. 19 is an exploded perspective view of the fourth preferred embodiment of a sensor device according to the present invention.
Figure 20:
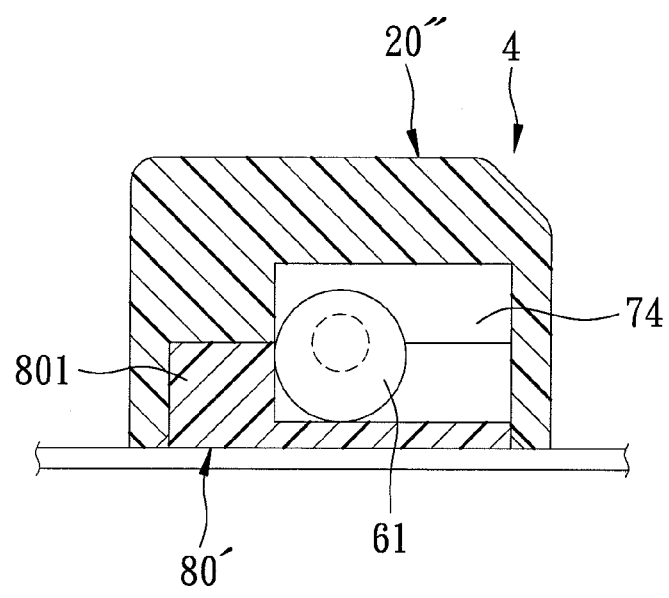
FIG. 20 is an assembled sectional view of the fourth preferred embodiment.
Figure 21:
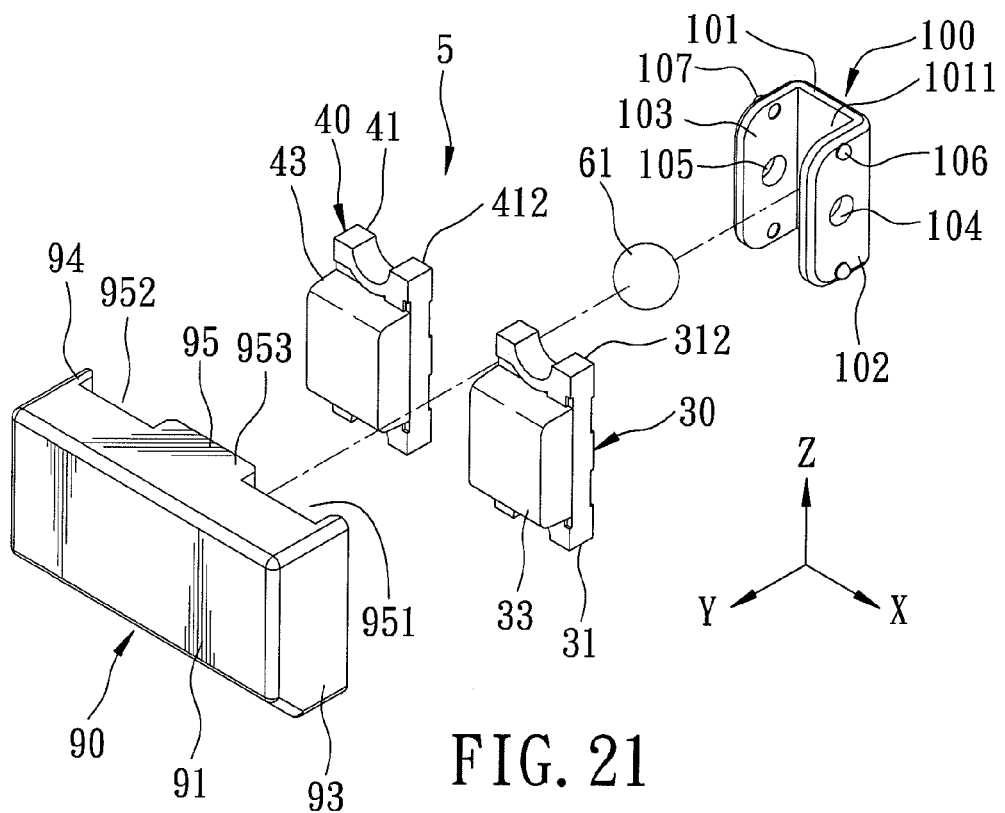
FIG. 21 is an exploded perspective view of the fifth preferred embodiment of a sensor device according to the present invention.
Figure 22:
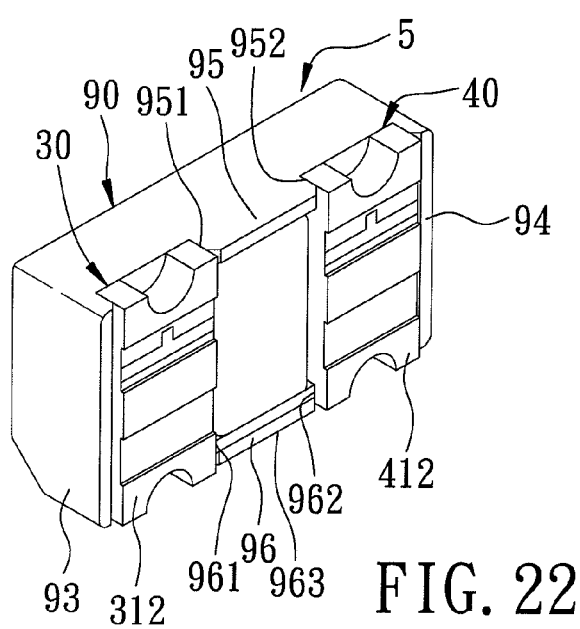
FIG. 22 is an assembled perspective view of the fifth preferred embodiment.

Referring to FIGS. 19 and 20, a sensor device 4 according to the fourth preferred embodiment of the present invention is shown to be similar to the third preferred embodiment. However, in this embodiment, the cover body 80' further has a stop piece 801 that extends across the second ball chamber half 87' at one end of the cover body 80' so as to cover said one end of the cover body 80', and the second ball chamber half 87' extends only through the other end of the cover body 80'. Hence, the sensor device 4 can be tilted to one side only so as to roll the ball member 61 away from blocking the signal path (I) to there by switch the sensor device 4 to an ON state. The sensor device 4, in this case, maybe used as a one-way switch or an angular switch.

Referring to FIGS. 21 to 27, a sensor device 5 according to the fifth preferred embodiment of the present invention is shown to be similar to the first preferred embodiment. Particularly, the sensor device 5 comprises a casing 90, an emitter 30, a receiver 40, a cover body 100, and a ball member 61. The casing 90 includes a base wall 91 having an inner surface 911, and two first sidewalls 93, 94 and two second sidewalls 95, 96 that cooperate with the base wall 91 to define a receiving space 92 which has an open end. The inner surface 911 has a semi-rectangular grooved surface portion 971. Each of the second sidewalls 95, 96 is grooved to form first and second engaging grooves 951, 961, 952, 962 in proximity to the first sidewalls 93, 94, respectively, and has an ungrooved intermediate portion 953, 963 between the first and second engaging grooves 951, 961, 952, 962. The emitter and receiver substrate bodies 33, 43 are disposed in the receiving space 92 substantially parallel to the base wall 91.

However, in this embodiment, the ball member 61 is non-transparent, and the cover body 100 includes a connecting plate 101 having an inner surface 1011, and two wing plates 102, 103 projecting transversely and respectively from two opposite ends of the connecting plate 101. The wing plates 102, 103 are respectively provided with an emitter light passage 104 and a receiver light passage 105. A plurality of engaging bosses 106, 107 are provided respectively on outer surfaces of the wing plates 102, 103. The inner surface 1011 of the connecting plate 101 is entirely planar between the wing plates 102, 103 and between two opposite ends thereof. The connecting plate 101 and the wing plates 102, 103 are disposed between and contact the ungrooved intermediate portions 953, 963 of the second sidewalls 95, 96. The wing plates 102, 103 extend partially into the grooved surface portion 971 of the base wall 91. The grooved surface portion 971, the connecting plate 101, and the wing plates 102, 103 cooperatively define a ball chamber 94 to receive the ball member 61. After assembly, the cover body 100 is disposed between the second sidewalls 95,96, and is engaged to and is disposed between the emitter 30 and the receiver 40. As such, the cover body 100, the emitter 30, and the receiver 40 cooperatively close the open end of the receiving space 92.

Through the presence of the engaging bosses 106, 107 on the wing plates 102, 103, engagement of the cover body 100 with the emitter 30 and the receiver 40 can be enhanced. The emitter and receiver light passages 104, 105, the emitter 30, and the receiver 40 are aligned along the X-axis and cooperatively define a signal path (I). The ball member 61 is rollable within the ball chamber 94 so as to block and unblock the signal path (I).

Figure 23:
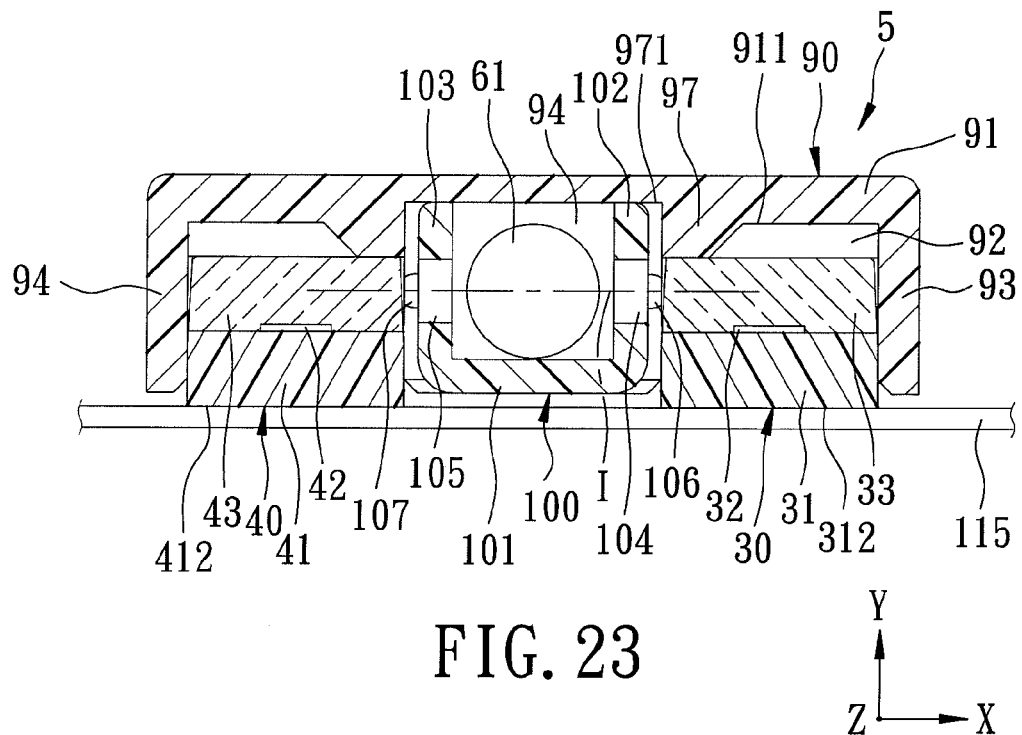
FIG. 23 is an assembled sectional view of the fifth preferred embodiment.
Figure 24:
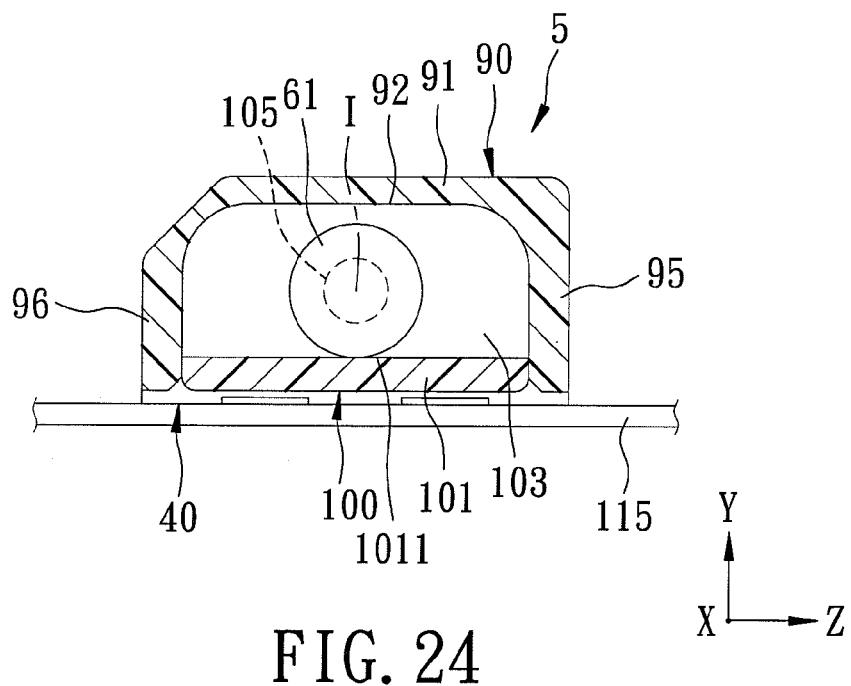
FIG. 24 is another assembled sectional view of the fifth preferred embodiment, illustrating a ball member blocking a signal path.
Figure 25:
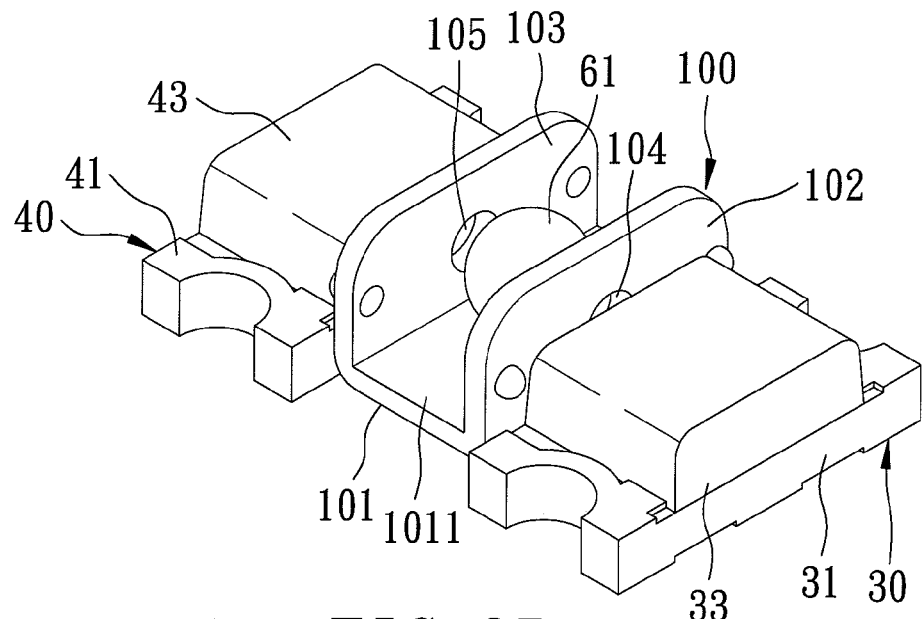
FIG. 25 is an assembled perspective view of an emitter, a receiver, a cover body, and the ball member of the fifth preferred embodiment.
Figure 26:
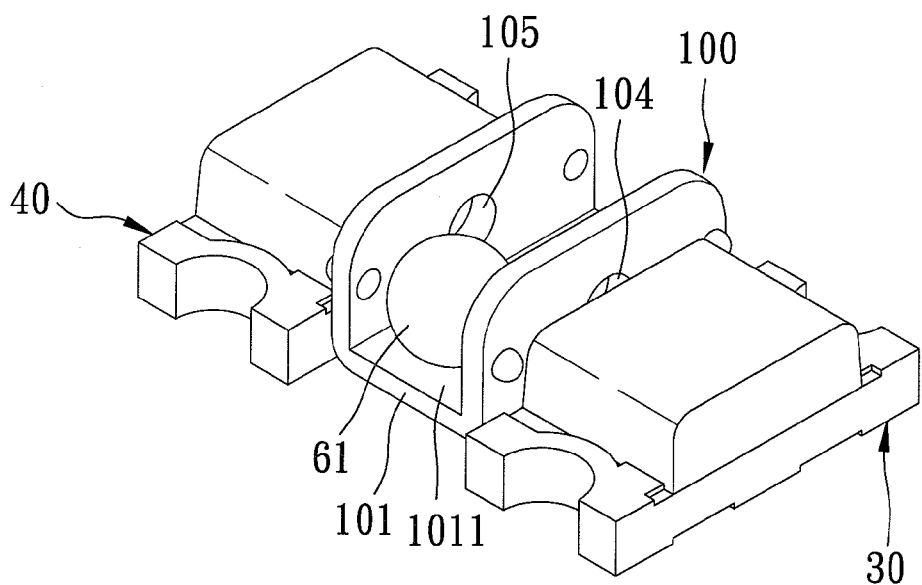
FIG. 26 is a view similar to FIG. 25, but illustrating the ball member disposed on one side of a ball chamber and away from blocking the signal path.
Figure 27:
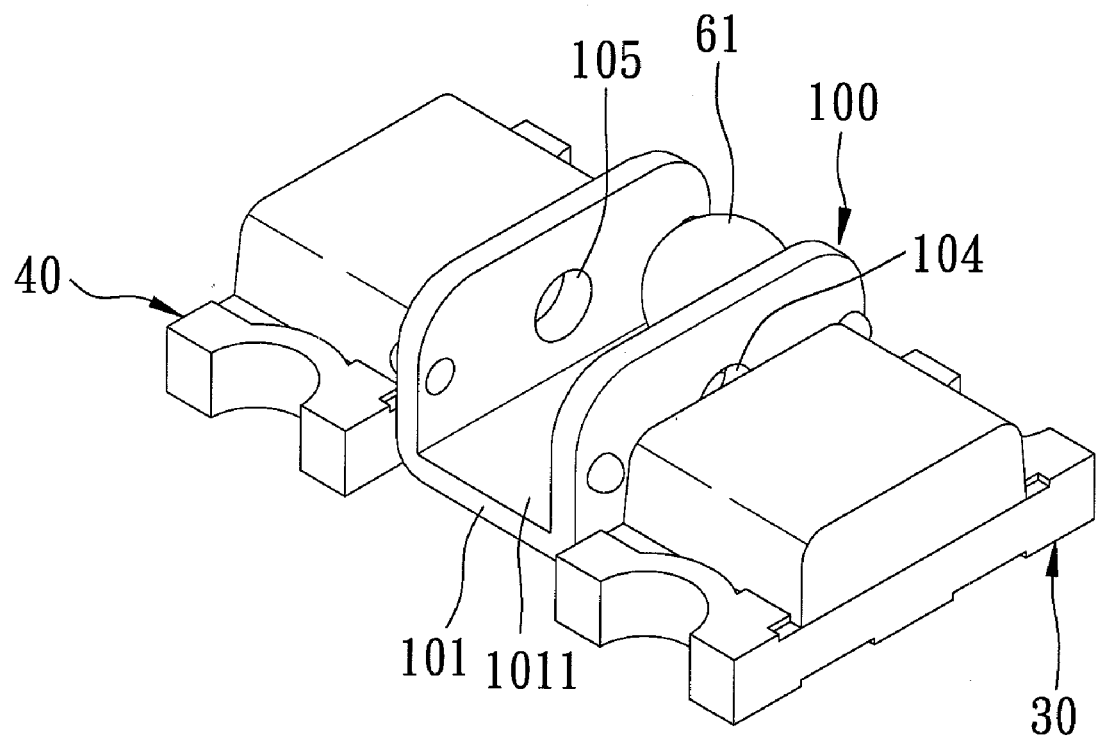
FIG. 27 is a view similar to FIG. 25, but illustrating the ball member disposed on another side of the ball chamber and away from blocking the signal path.

In use, the outer faces 312, 412 of the emitter 30 and the receiver 40 are soldered fixedly to a circuit board 115 so as to interconnect electrically the sensor device 5 and the circuit board 115. As shown in FIGS. 23 to 25, when the ball member 61 is located between the emitter and receiver light passages 104, 105 so as to block the signal path (I), the sensor device 5 is placed in an OFF state. When the sensor device 5 is tilted so as to roll the ball member 61 away from blocking the signal path (I), as shown in FIGS. 26 and 27, the sensor device 5 is switched to an ON state. Through such an operation, the sensor device 5 may be used as a two-way switch or an angular switch.

Figure 28:
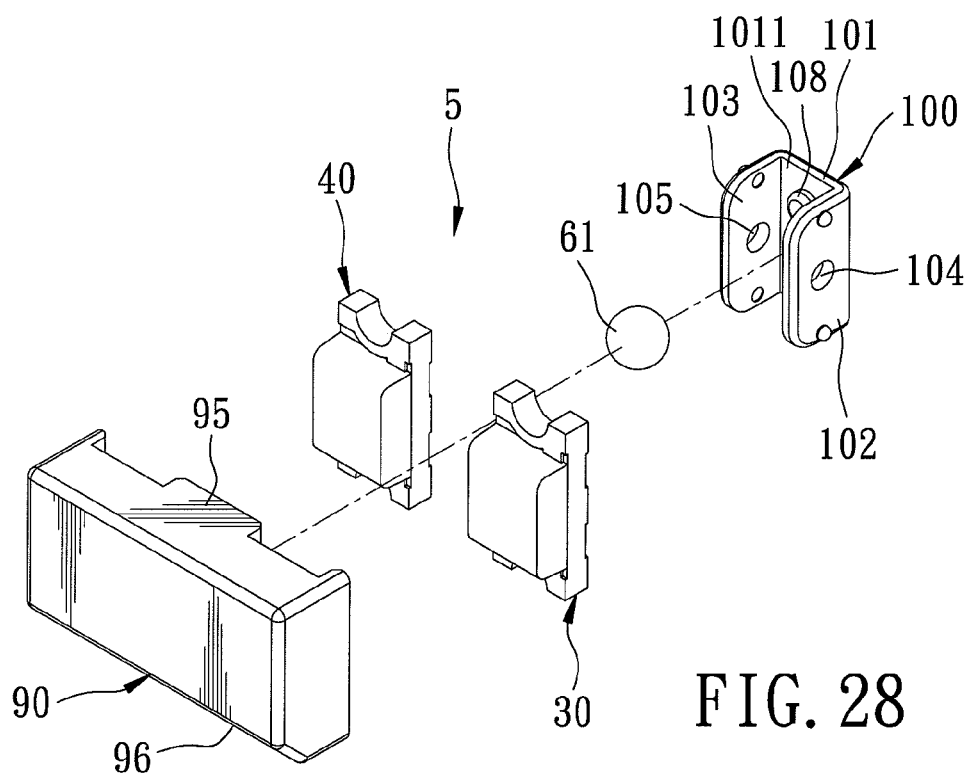
FIG. 28 is a view similar to FIG. 21, but illustrating an alternative form of the cover body.
Figure 29:
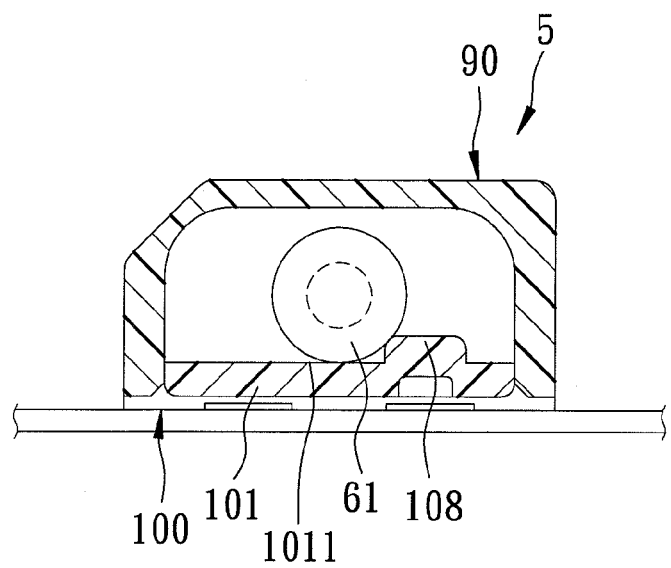
FIG. 29 is an assembled sectional view of FIG. 28.

Referring to FIGS. 28 and 29, the inner face 1011 of the connecting plate 101 of the cover body 100 may be provided with a blocking piece 108 protruding therefrom in proximity to one end of the connecting plate 101 that contacts one of the second sidewalls 95, 96. As such, the sensor device 5 may be tilted to one side only so as to roll the ball member 61 away from blocking the signal path (I), thereby placing the sensor device 5 to an ON state. In this case, the sensor device 5 may be used as a one-way switch.

Figure 30:
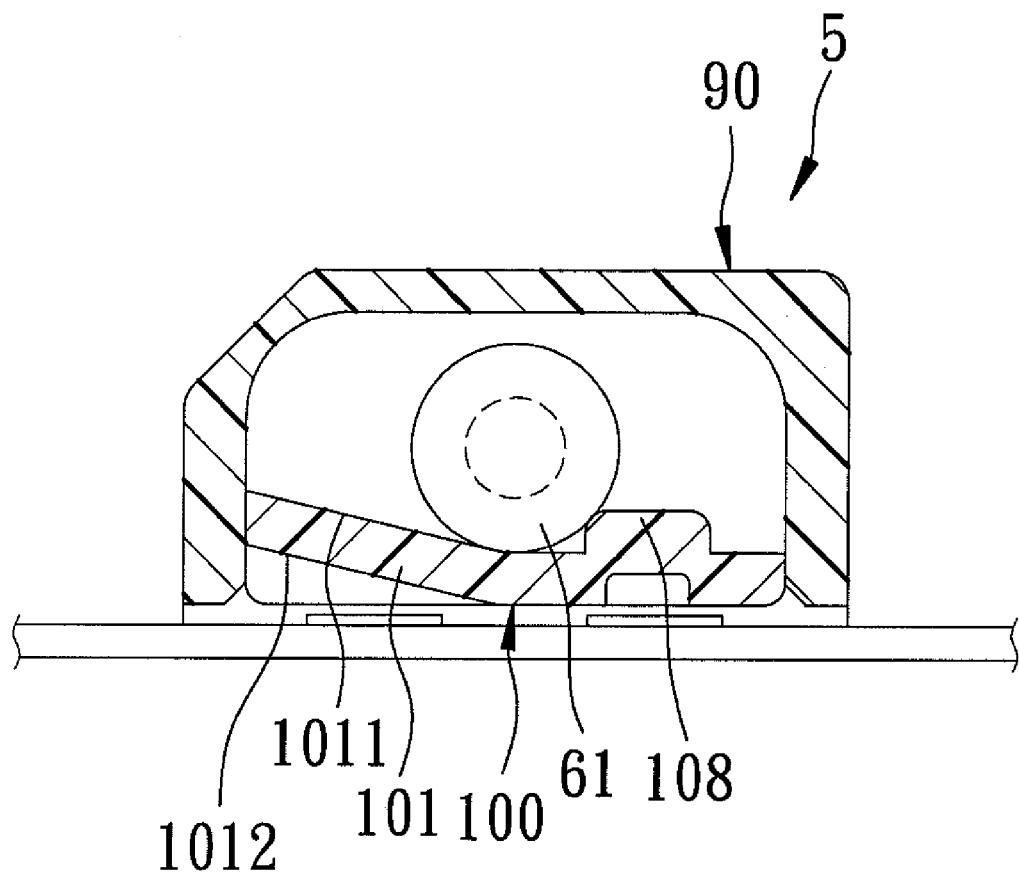
FIG. 30 is a view similar to FIG. 29, but illustrating an alternative form of the cover body.

Referring to FIG. 30, the inner surface 1011 of the connecting plate 101 of the cover body 100, aside from being provided with the blocking piece 108, may be further provided with an inclined surface portion 1012 opposite to the blocking piece 108. As such, the sensor device 5 may be tilted to one side only so as to roll the ball member 61 away from blocking the signal path (I), thereby placing the sensor device 5 to an ON state. The sensor device 5 may be similarly used as a one-way switch.

Figure 31:
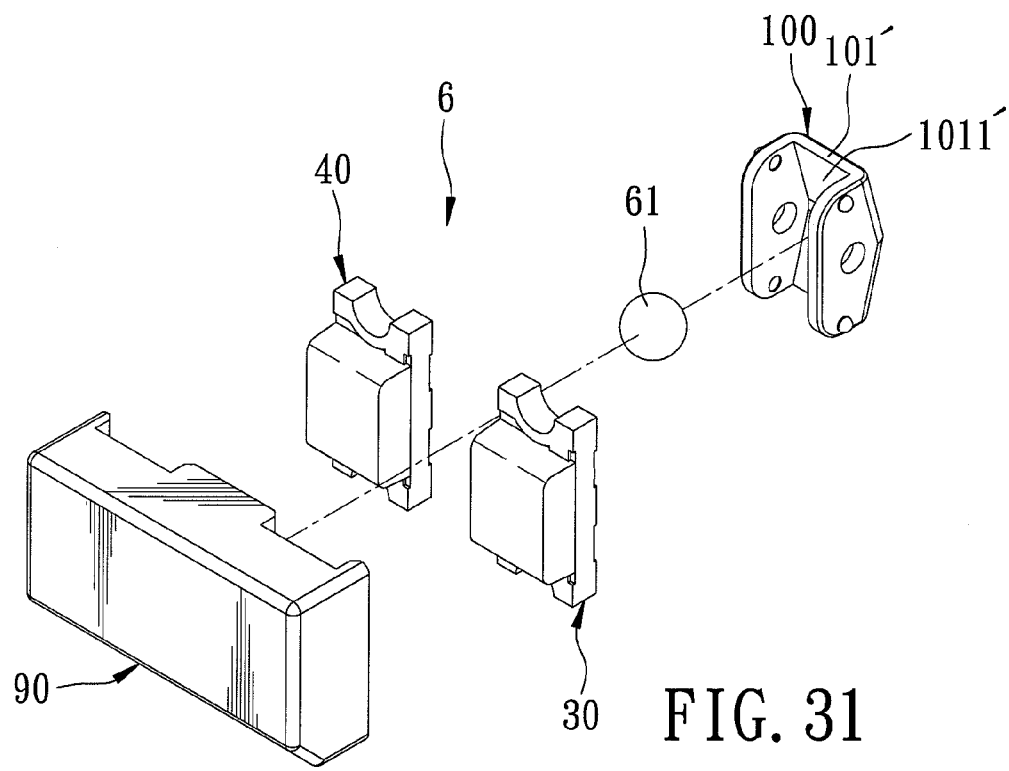
FIG. 31 is an exploded perspective view of the sixth preferred embodiment of a sensor device according to the present invention.
Figure 32:
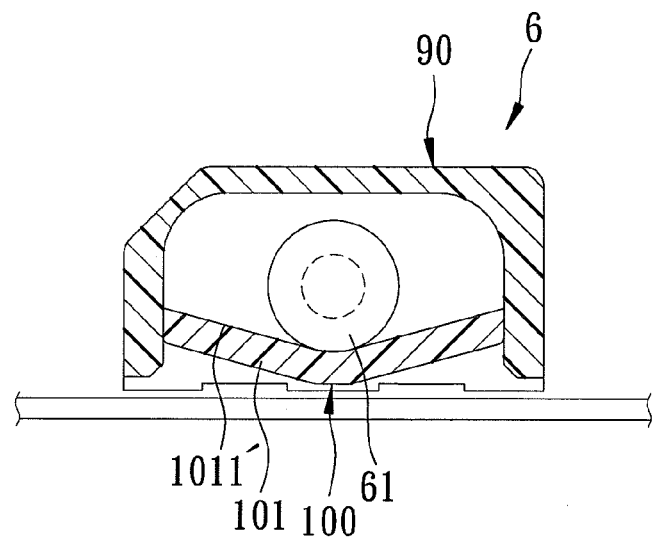
FIG. 32 is an assembled sectional view of the sixth preferred embodiment.

Referring to FIGS. 31 and 32, a sensor device 6 according to the sixth preferred embodiment of the present invention is shown to be similar to the fifth preferred embodiment. However, in this embodiment, the connecting plate 101' of the cover body 100' is a substantially V-shaped plate. After assembly, the sensor device 6 may be tilted in two directions so as to roll the ball member 61 away from blocking the signal path (I) to thereby place the sensor device 6 to an ON state. This configuration allows the sensor device 6 to be used as a two-way switch or an angular switch.

Figure 33:
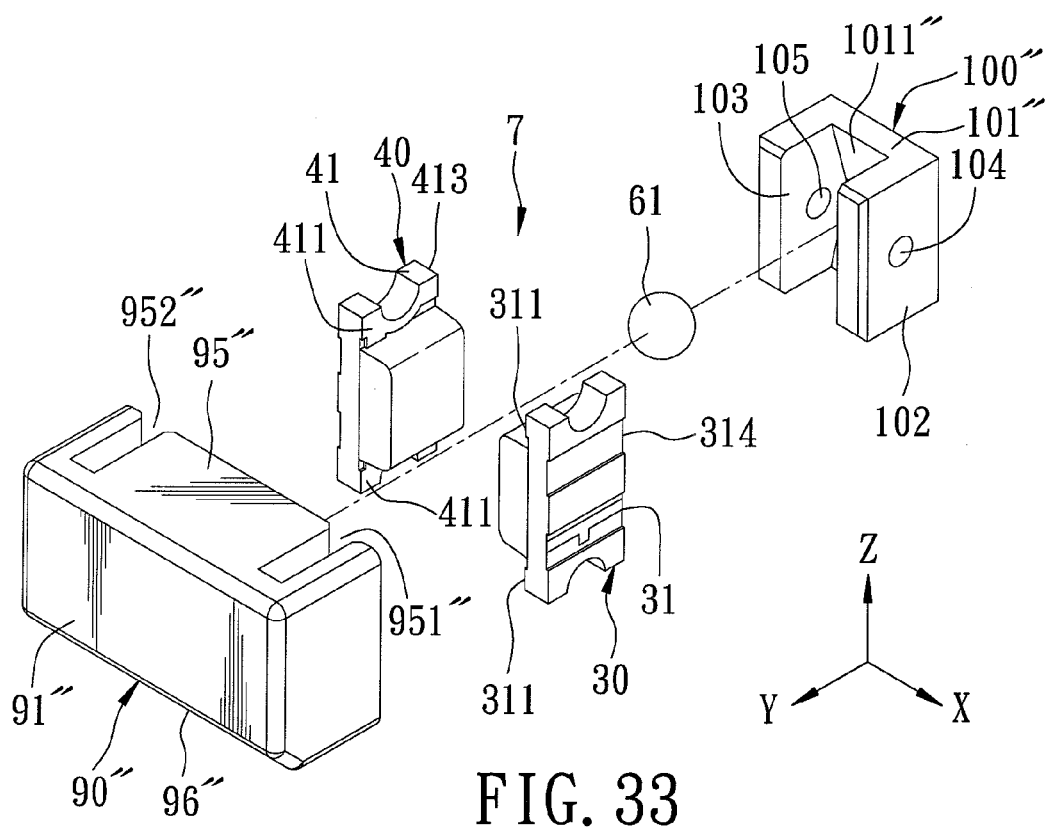
FIG. 33 is an exploded perspective view of the seventh preferred embodiment of a sensor device according to the present invention.
Figure 34:
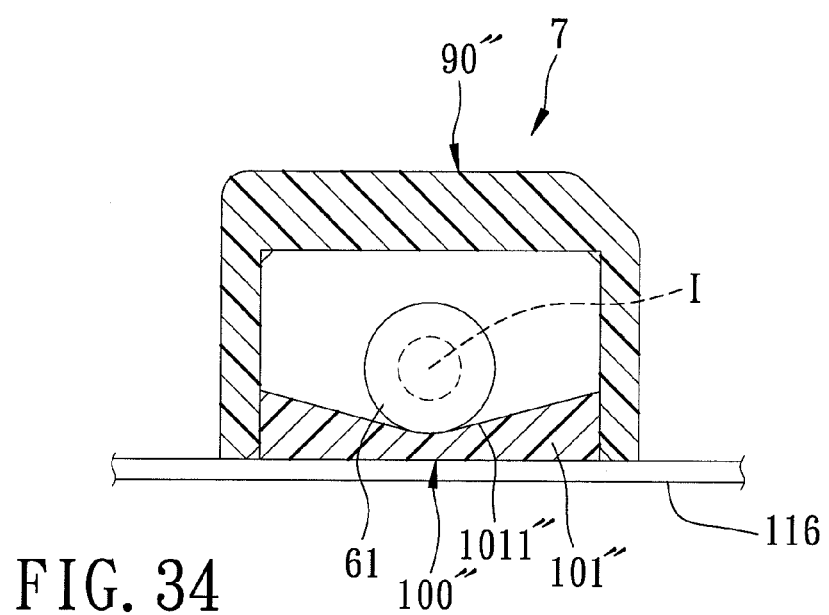
FIG. 34 is an assembled sectional view of the seventh preferred embodiment.

Referring to FIGS. 33 and 34, a sensor device 7 according to the seventh preferred embodiment of the present invention is shown to be similar to the fifth preferred embodiment. However, in this embodiment, the inner surface 1011" of the connecting plate 101" of the cover body 100" defines an indentation of substantially V-shaped cross section. The second sidewalls 95", 96" of the casing 90" are respectively grooved in such a way that the first engaging grooves 951", 961 (see FIG. 22) can receive and engage respectively the first connecting portions 311 of the emitter substrate body 31, and that the second engaging grooves 952", 962 (see FIG. 22) can receive and engage respectively the second connecting portions 411 of the receiver substrate body 41 when the emitter 30 and the receiver 40 are disposed transversely to the base wall 91" along the Y-axis. The emitter and receiver elements 32, 42 (see FIG. 23) face each other at this time, and the side faces 314, 413 of the emitter and receiver substrate bodies 31, 41 may be soldered fixedly to a circuit board 116. After assembly, the sensor device 7 may be tilted in two directions so as to roll the ball member 61 away from blocking the signal path (I), thereby placing the sensor device 7 to an ON state.

Figure 35:
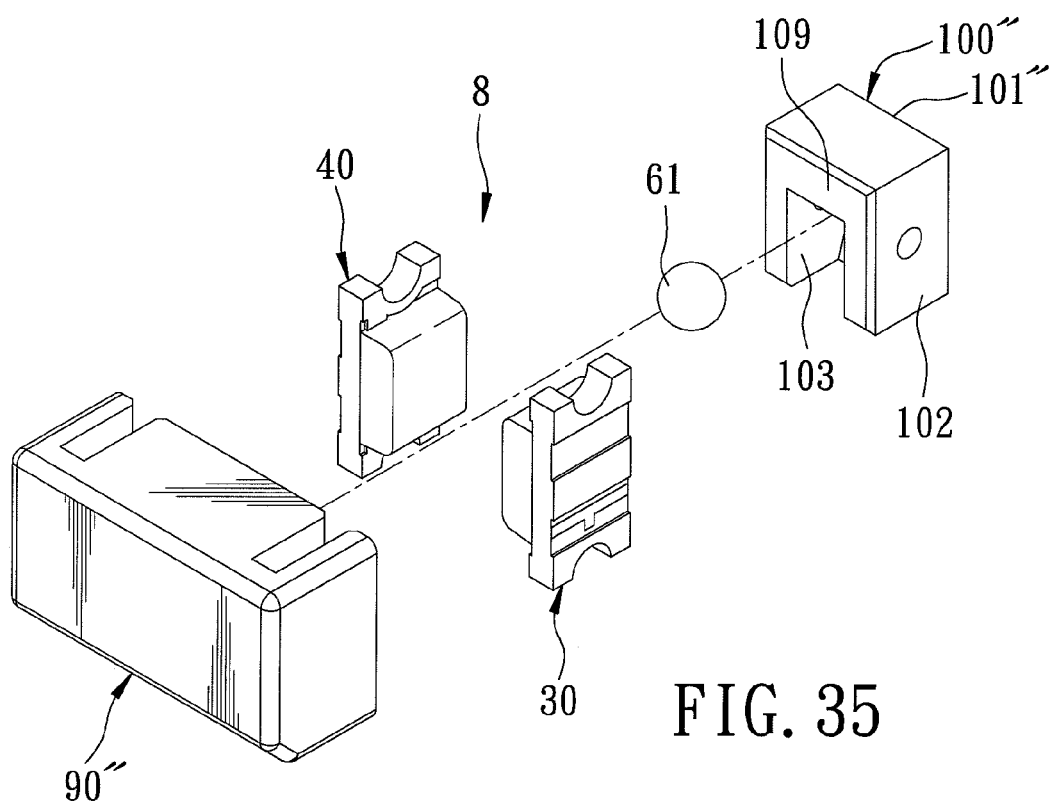
FIG. 35 is an exploded perspective view of the eighth preferred embodiment of a sensor device according to the present invention.
Figure 36:
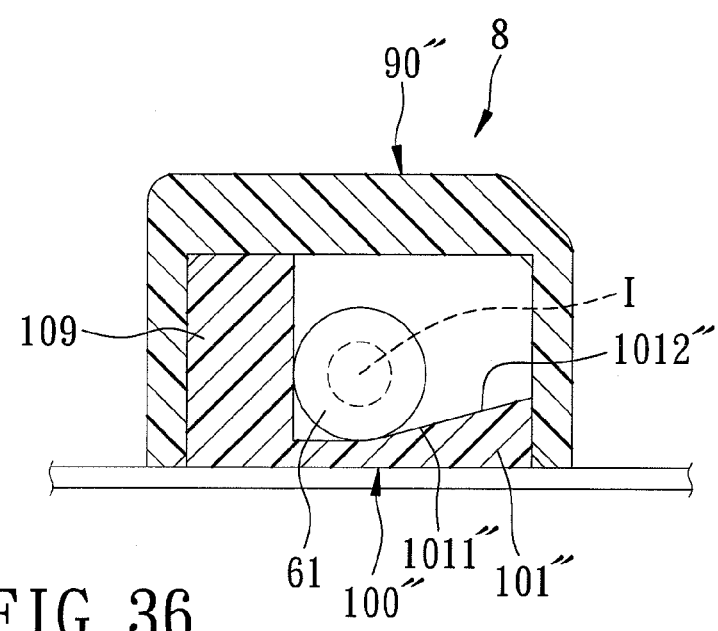
FIG. 36 is an assembled sectional view of the eighth preferred embodiment.

Referring to FIGS. 35 and 36, a sensor device 8 according to the eighth preferred embodiment of the present invention is shown to be similar to the seventh preferred embodiment. However, in this embodiment, the cover body 100" further includes a cross plate 109 protruding from the connecting plate 101" at one end thereof and interconnecting the wing plates 102, 103. As such, the inner surface 1011" of the connecting plate 101" has an inclined surface portion 1012" that extends inclinedly from the cross plate 109 to the other end of the connecting plate 101" which is opposite to said one end of the connecting plate 101". After assembly, the sensor device 8 can be tilted to one side only so as to roll the ball member 61 away from blocking the signal path (I) to thereby place the sensor device 8 to an ON state.

From the aforementioned description, it is apparent that, as compared to the conventional vibration switch 10 (see FIG. 1), the sensor device 1, 2, 3, 4, 5, 6, 7, 8 of the present invention has fewer components, is easier to assemble so that assembly time is minimized, and has a smaller volume.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A sensor device comprising:
a casing including a base wall, and a plurality of sidewalls extending transversely from a peripheral end of said base wall and cooperating with said base wall to define a receiving space that has an open end opposite to said base wall, said sidewalls including two opposite first sidewalls and two opposite second sidewalls transverse to said first sidewalls, said base wall having an inner surface facing said receiving space, each of said second sidewalls being rooved to form first proximity to said first sidewalls, respectively;
an emitter disposed in said receiving space in proximity to one of said first sidewalls and including an emitter element to emit a light signal, an emitter substrate body connected electrically to said emitter element and having two opposite first connecting portions, and an emitter transparent body fixed to a portion of said emitter substrate body between said two first connecting portions and covering said emitter element, said emitter transparent body being disposed between and engaged to said second sidewalls, said first connecting portions engaging respectively said first engaging grooves of said second sidewalls;

a receiver disposed in said receiving space in proximity to the other one of said first sidewalls and including a receiver element to receive said light signal, a receiver substrate body connected electrically to said receiver element and having two opposite second connecting portions, and a receiver transparent body fixed to a portion of said receiver substrate body between said two second connecting portions and covering said receiver element, said receiver transparent body being disposed between and engaged to said second sidewalls, said second connecting portions engaging respectively said second engaging grooves of said second sidewalls;

a cover body disposed in said receiving space between said second sidewalls and between said emitter and said receiver, said cover body having an inner surface;

said cover body, said emitter, and said receiver cooperatively closing said open end of said receiving space;

a ball chamber formed between said inner surfaces of said base wall and said cover body;

a ball member disposed movably in said ball chamber;

an emitter light passage optically communicating with said ball chamber and said emitter; and a receiver light passage optically communicating with said ball chamber and said receiver.

2. The sensor device of claim 1, wherein said inner surface of said base wall is grooved to form a first ball chamber half, and said inner surface of said cover body is grooved to form a second ball chamber half that cooperates with said first ball chamber half to define said ball chamber.

3. The sensor device of claim 2, wherein said first and second ball chamber halves are semi-spherical.

4. The sensor device of claim 2, wherein said first and second ball chamber halves are semi-cylindrical.

5. The sensor device of claim 2, wherein said inner surface of said base wall is grooved to form a first emitter passage half and a first receiver passage half provided respectively on two opposite sides of said first ball chamber half, said inner surface of said cover body being grooved to form a second emitter passage half and a second receiver passage half provided respectively on two opposite sides of said second ball chamber half, said first and second emitter passage-halves complementing each other to confine said emitter light passage, said first and second receiver passage-halves complementing each other to confine said receiver light passage that is aligned with said emitter light passage.

6. The sensor device of claim 1, wherein each of said second sidewalls has an ungrooved intermediate portion between said first and second engaging grooves, said cover body engaging said second sidewalls between said ungrooved intermediate portions.

7. The sensor device of claim 1, wherein said emitter and receiver substrate bodies are disposed substantially parallel to said base wall.

8. The sensor device of claim 1, wherein said emitter and receiver substrate bodies are disposed transversely to said base wall.

9. The sensor device of claim 6, wherein said inner surface of said base wall has a semi-rectangular grooved surface portion, said cover body including a connecting plate that has said inner surface of said cover body, and two wing plates projecting transversely and respectively from two opposite ends of said connecting plate and respectively provided with said emitter and receiver light passages, said connecting plate and said wing plates being disposed between and contacting said ungrooved intermediate portions of said second sidewalls, said wing plates extending partially into said grooved surface portion, said ball chamber being defined by said grooved surface portion, said connecting plate, and said wing plates.

10. The sensor device of claim 9, wherein said inner surface of said connecting plate is entirely planar between said wing plates and between two opposite ends thereof that contact said second sidewalls.

11. The sensor device of claim 9, wherein said inner surface of said connecting plate has a blocking piece protruding therefrom in proximity to one end of said connecting plate that contacts one of said second sidewalls.

12. The sensor device of claim 9, wherein said inner surface of said connecting plate has a blocking piece protruding therefrom in proximity to one end of said connecting plate that contacts one of said second sidewalls, and an inclined surface portion opposite to said blocking piece.

13. The sensor device of claim 9, wherein said connecting plate of said cover body is a substantially V-shaped plate.

14. The sensor device of claim 9, wherein said inner surface of said connecting plate defines an indentation of substantially V-shaped cross section.

15. The sensor device of claim 9, wherein said cover body further includes a cross plate protruding from said connecting plate at one end of said connecting plate and interconnecting said wing plates, and said inner surface of said connecting plate has an inclined surface portion that extends inclinedly from said cross plate to the other end of said connecting plate opposite to said one end of said connecting plate.

* * * * *